(12) United States Patent
Leuschner

(10) Patent No.: US 6,320,473 B1
(45) Date of Patent: Nov. 20, 2001

(54) INTEGRATED OSCILLATOR CIRCUIT APPARATUS WITH CAPACITIVE COUPLING FOR REDUCING START-UP VOLTAGE

(75) Inventor: Horst Leuschner, Jamul, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/409,494

(22) Filed: Sep. 30, 1999

(51) Int. Cl.[7] ............................. H03B 5/36; H02H 7/20
(52) U.S. Cl. .................. 331/116 FE; 331/75; 331/158; 331/62
(58) Field of Search .................... 331/116 R, 116 FE, 331/158, 159, 75, 62

(56) References Cited

U.S. PATENT DOCUMENTS 3,721,084 * 3/1973 Dargent ........................... 331/116 R
5,113,156 * 5/1992 Mahabadi et al. ............. 331/116 FE
5,757,242 * 5/1998 Chow et al. .................... 331/116 FE
5,909,152 * 6/1999 Li et al. ......................... 331/116 FE
5,929,715 * 7/1999 Nakamiya et al. .................. 331/158

* cited by examiner

*Primary Examiner*—Siegfried H. Grimm
(74) *Attorney, Agent, or Firm*—Theodore E. Galanthay; Lisa K. Jorgenson; Peter J. Thoma

(57) ABSTRACT

The present invention relates to oscillator circuits for providing periodic signals. The oscillator circuit includes a crystal element having a high Q value and good stability. A high-gain amplifier is used with the crystal element to produce an oscillating signal. The oscillator is further configured to include an input protection circuit for reducing the effects of undesirably high input voltage levels, and a coupling capacitor to reduce leakage between the amplifier and the input protection circuit. A high output signal level is provided to a Schmidtt trigger amplifier through configuring the output to be taken from the input of the high-gain amplifier.

15 Claims, 2 Drawing Sheets

INTEGRATED OSCILLATOR CIRCUIT APPARATUS WITH CAPACITIVE COUPLING FOR REDUCING START-UP VOLTAGE

FIELD OF THE INVENTION

The present invention generally relates to oscillator circuits. More particularly, the invention is directed to an oscillator integrated circuit apparatus using high feedback amplification.

BACKGROUND OF THE INVENTION

Oscillator circuits have been known in the art for quite some time. Common applications include providing clock signals for integrated circuits, multiplexed displays, and counters. More complex applications range from digital signal processing to providing signals for the sample rates of A/D converters. The periodic signals provided by oscillator circuits have become as critical as power supplies used to power electronics.

Essentially, an oscillator circuit produces an output signal at a particular level having a certain period. Common configurations of oscillator circuits include state variable oscillators, Wien bridge oscillators, and Colpitts oscillators. FIG. 1 is a simplified illustration of a crystal oscillator circuit commonly known in the art. The crystal oscillator includes a vibrating element or crystal Y1 generally made of quartz, glass, silicon dioxide, etc. that is cut and polished to vibrate at a certain frequency (i.e., 32,768 MHZ, 100 MHZ, etc.). The crystal is a two terminal device consisting of the slice of quartz positioned between two conducting plates. The quartz crystal has a piezoelectric property that undergoes mechanical deformation in response to an electric field produced across the plates. From a terminal point of view, the crystal behaves as if it were a tuned RLC circuit. Crystals designed for oscillator circuits have very good stability with Q values greater than 10,000.

The circuit in FIG. 1 includes an inverting amplifier A1 with a feedback resistor R1 for providing gain to the amplifier A1. Input capacitor C1 and output capacitor C2 are typically balanced for maintaining a voltage of V/2. With a potential across the terminals of Y1, and amplifier A1 biased to become oscillatory, a small input level to amplifier A1 produces an oscillating output signal. Amplifier A1 is configured to be a high gain amplifier that operates at a resonant frequency determined by crystal Y1. The crystal oscillator circuit provides sustained oscillations having good stability characteristics for oscillatory control as well as for providing signals for high-performance processors.

Notwithstanding, oscillator circuits utilizing vibrating elements such as quartz have design limitations. One limitation is providing sufficient start-up voltage for amplifier A1 to begin oscillations. With capacitors C1 and C2 having an evenly distributed voltage between the input and output terminals, a start-up voltage, usually in the form of noise, must be provided to begin oscillations. Varying battery life of electronic devices using low-voltage oscillation circuits put a constraint on providing enough start-up voltage to begin oscillations.

A further limitation of crystal oscillator circuits is the interaction of the vibrating crystal with the oscillating amplifier. Within crystal oscillator circuits, and in particular for low voltage oscillator circuits, the interaction between the crystal and the amplifier can lead to a residual periodic shifting, or jitter of the output signal which is very undesirable at higher frequencies.

There are additional design considerations when developing microelectronic oscillator circuits having high gain amplifiers. One fatalistic deficiency of using high gain feedback amplifiers in microelectronics is caused by leakage currents inherent to Field Effect Transistors (FETs). FIG. 2A is a simplified illustration of how leakage occurs in a FET. FET 200 includes a p-type substrate 201 having gate oxide 202 and gate 203 typically made of metal or doped polysilicon. The p-type substrate is doped having n+ source 204 and drain 205 areas. In this illustration, leakage occurs in two ways. The first leakage, $I_{subthreshold}$ occurs between the source and drain of the FET. In smaller geometry FETs, the potential barrier of the device is controlled by both the gate-to-source voltage $V_{GS}$ and the drain-to-source voltage $V_{DS}$. If the drain voltage is increased, the potential barrier in the channel decreases, leading to drain-induced barrier lowering. This reduction in the potential barrier eventually allows electron flow between the source and drain, even if the gate to source voltage is less than the threshold voltage $V_T$. The undesirable channel current that flows under this condition is a leakage current called subthreshold current, $I_{subthreshold}$.

The second type of current leakage resident in FETs occurs due the reverse bias condition of the source/drain to p-type substrate junctions. The reverse conduction, $I_{reverser}$, of each junction occurs mainly due to the reverse saturation current and the generation current which originate in the depletion regions of the source/drain p-type substrate junctions. This current is a function of the bias voltage present at the terminals $V_D$ and $V_S$ with respect to the p-type substrate.

Total leakage, therefore, is the combination of the leakage caused due to each of these elements as illustrated in FIG. 2B, which is the equivalent circuit of FIG. 2A.

$$I_{leakage} = I_{subthreshold} + I_{reverse}$$

When leakage current associated with a FET is present, it places a constraint on the applicability of FETs within oscillator circuits. A common device used in microelectronic circuits is an ESD protection circuit for eliminating static discharge effects on FETs. Typically, ESD protection circuits are designed using FETs having minimal channel lengths (L) with a large widths (W). The ESD protection circuit is used to clamp the input signal level to a certain voltage in order to minimize the impact of the ESD. However, as the channel lengths FETs used within ESD protection circuits are reduced, larger values of $I_{subthreshold}$ leakage occurs within the circuit. In an oscillator circuit using an ESD protection circuit and a high gain amplifier, $I_{leakage}$ as little as 7 nA will render the oscillator useless.

Therefore, the present invention overcomes the design challenges presented by the above deficiencies and, more particularly, reduces the intrinsic effects associated with developing microelectronic devices having oscillator circuits.

SUMMARY OF THE INVENTION

The present invention overcomes the fundamental individual constraints of conventional oscillator circuits by providing an oscillator circuit having a coupling capacitor isolating the input terminal of a crystal element and the feedback resistor of a high gain inverting oscillating amplifier. By isolating the input terminal from the feedback resistor, the present invention overcomes the effects of undesirable offset voltages associated with leakage currents. The present invention further provides an oscillator circuit having an input capacitor that is smaller relative to the output capacitor, thus reducing the start-up voltage required to start oscillations within the oscillator circuit. Furthermore, the present invention reduces the effects of jitter at the output stage through providing a high level signal at the input of the inverting amplifier.

In one form, the invention relates to an integrated circuit apparatus comprising at least one input protection circuit, an element coupled to the at least one input protection circuit wherein the element is configured to resonate, an amplifier coupled to the element, the amplifier having a feedback network, and a coupling element coupled to the amplifier and the input protection circuit, wherein the coupling element reduces current leakage between the amplifier and the input protection circuit.

In another form, the invention relates to an oscillator circuit apparatus comprising an element having at least one terminal, wherein the element is configured to resonate, an oscillator having an input terminal and an output terminal, the input terminal coupled to the element, and an output stage coupled to the input terminal of the oscillator for receiving a signal from the oscillator circuit.

These and other features of the invention will be more clearly understood and appreciated upon considering the detailed embodiments described hereinafter.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

DETAILED DESCRIPTION OF A PREFERRED EMBODIMENT OF THE INVENTION

In the following detailed description of the preferred embodiments, reference is made to the accompanying drawings which form a part hereof, and in which are shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

The conceptual groundwork for the present invention involves reducing the deficiencies noted above through providing an integrated circuit having an element configured to resonate at a frequency. The element is coupled to an input protection circuit for reducing the effects of ESD. The integrated circuit further includes a high-gained amplifier having a feedback network with the amplifier biased to become oscillatory. Further, the integrated circuit includes a coupling element coupled to the input protection circuit and the high-gain amplifier for reducing the amount of leakage current between the input protection circuit and amplifier.

Figure 1:
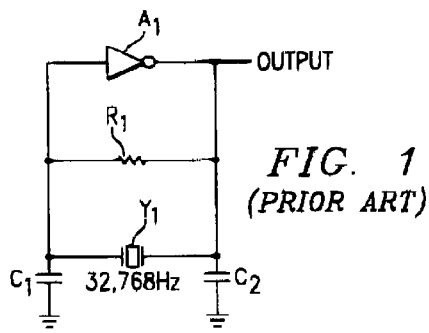
FIG. 1 is a prior art illustration of a crystal oscillator circuit.
Figure 2A:
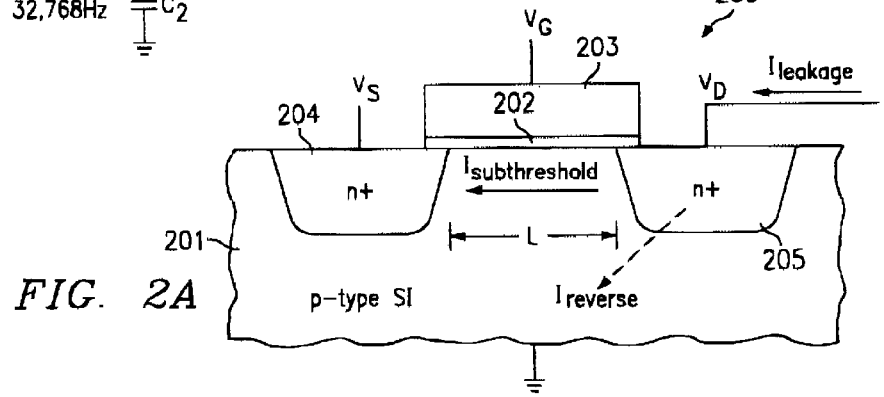
FIG. 2A is an illustration of leakage current associated with state of the art microelectronic devices.
Figure 2B:
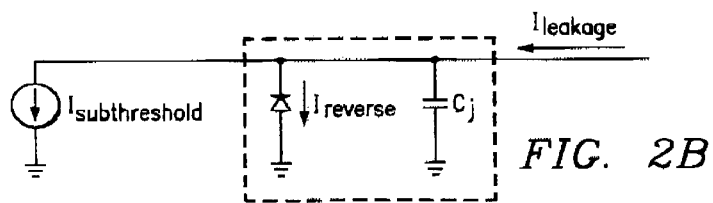
FIG. 2B is an equivalent circuit of FIG. 2A.
Figure 3:
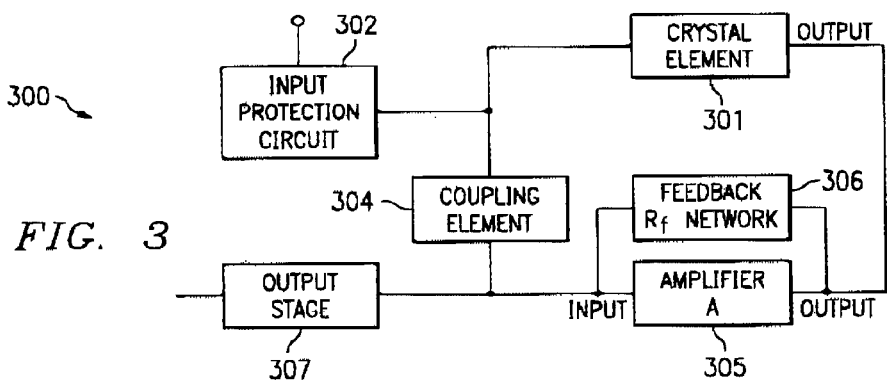
FIG. 3 schematically depicts a simplified block diagram of the present invention.

FIG. 3 illustrates a simplified block diagram of a circuit in accordance with the present invention. Circuit 300 is configured to have an element such as crystal 301 configured to resonate at a frequency. The element may be of any form such as quartz, glass, silicon dioxide, etc. capable of producing a resonant frequency. The input of crystal 301 is coupled to input protection circuit 302 for providing ESD protection to circuit 300. ESD protection circuits are well known in the art and in one form reduce the effects of static electricity by clamping the input terminal to a safe voltage level. Circuit 300 further includes amplifier 305 having feedback network 306 for providing gain to amplifier 305.

In one embodiment of the instant invention, amplifier 305 is configured to be a high gain inverting amplifier biased to become oscillatory. Coupled to amplifier 305 and input protection circuit 302 is coupling element 304. In a preferred embodiment of the present invention, coupling element 304 is capacitive and configured to reduce the effects of leakage current between input protection circuit 302, crystal element 301, and amplifier 305. The input terminal of amplifier 305 is also coupled to output stage 307 for providing the output signal of circuit 300. Through coupling output stage 307 to the input of amplifier 305, unwanted oscillatory effects such as jitter are significantly reduced due to the high Q value of element 301. Additionally, by coupling output stage 307 to the input of amplifier 305, a high amplitude signal can be provided to output stage 307.

Figure 4:
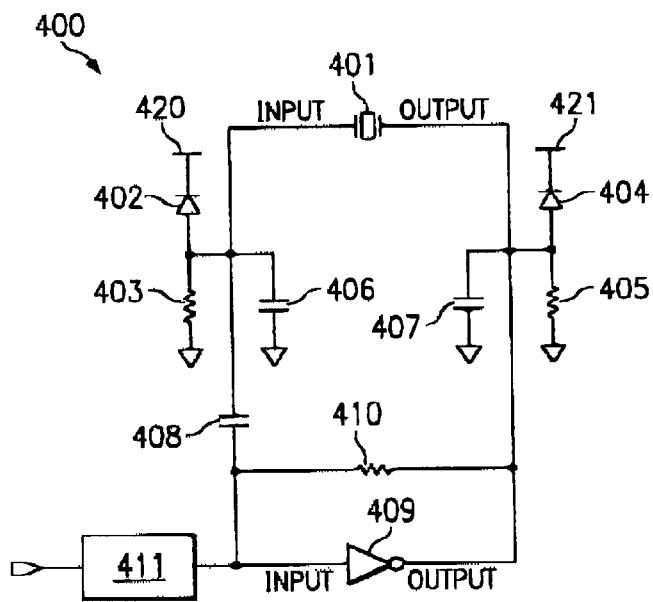
FIG. 4 schematically illustrates an oscillator apparatus according to one embodiment of the present invention.

Referring now to FIG. 4, an illustration is provided of an oscillator apparatus according to one embodiment of the present invention. FIG. 4 is a schematic illustrating one configuration of components in accordance with the instant invention. It will be understood that other components and their equivalents may be substituted without departing from the spirit and scope of the present invention. Oscillator 400 includes a crystal 401 having a high Q value (i.e. greater than 10,000), good stability, and configured to resonate at a frequency. Crystal element 401 is coupled to an input protection circuit that includes diodes 402/404 and resistors 403/405. The input protection network ensures that any undesirable voltage levels input to oscillator 400 through pads 420/421 are reduced to a safe operating level.

Oscillator 400 includes high-gain inverting amplifier 409 having feedback resistor 410 for providing gain to amplifier 409. In a preferred embodiment, amplifier 409 is biased to begin oscillations upon receiving an appropriate input signal. A coupling element, capacitor 408, is coupled to the input terminal of amplifier 409, the input protection circuit, and crystal 401. Capacitor 408 ensures that leakage current between input protection circuit, crystal 401, and amplifier 409 is reduced and undesirable voltage offsets created by the leakage currents interacting with feedback resistor 410 are minimized. Output stage 411 is coupled to the input terminal of amplifier 409 for providing the oscillator's output signal. In a preferred embodiment, output stage 411 includes two inverting buffers and a trigger amplifier, such as a Schmidt trigger amplifier, for outputting the oscillator's generated signal.

The input and output terminals of crystal 401 and amplifier 409 are coupled to input capacitor 406 and output capacitor 407 respectively. Preferably, input capacitor 406 is smaller than output capacitor 407, thus providing a high input voltage to amplifier 409 ensuring a low start-up voltage for amplifier 409 to begin oscillations. Additionally, by providing a higher input voltage level, the output signal can be taken from the input terminal of amplifier 409.

Figure 5:
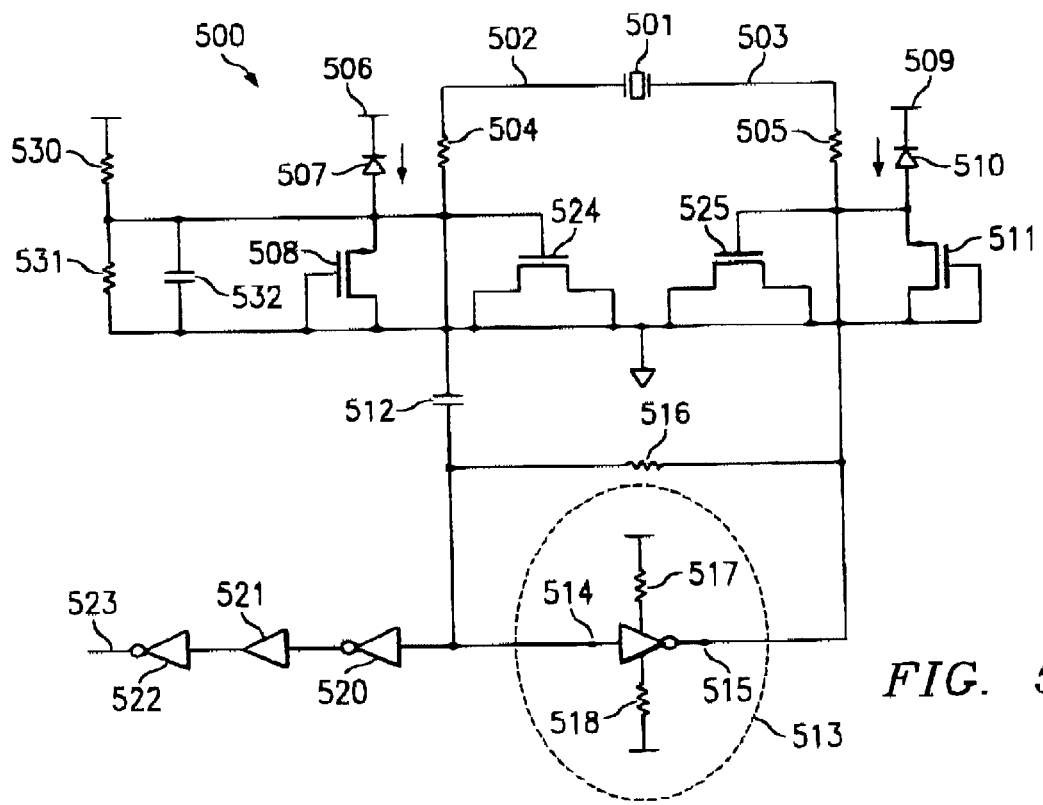
FIG. 5 schematically illustrates an integrated circuit according to one embodiment of the present invention.

Referring now to FIG. 5 a schematic illustration of an integrated circuit according to one embodiment of the present invention. FIG. 5 is an illustration of one configuration of electronic components in accordance with the instant invention. It will be understood that other components and their equivalents may be used without departing from the spirit and scope of the present invention. In a preferred embodiment of the present invention, the circuit illustrated in FIG. 5 is a microelectronic circuit designed for implementation utilizing silicon processing techniques that are well known in the art. Such processes, as described in S. Wolf and R. N. Tauber's book, "Silicon Processing for the VLSI Era" are herein incorporated by reference. The integrated circuit in FIG. 5 utilizes several devices that are presently known in the art. A MOSFET ("Metal-Oxide-Semiconductor Field-Effect Transistor") device can generally be described as having a gate region separated from a conducting channel by a thin layer of $SiO_2$ (glass) grown onto a channel. The gate, which may be either metal or doped silicon, is truly insulated from the source-drain circuit, with characteristic input resistance >$10^{14}$ ohms, affecting channel conduction purely by its electric field. The gate insulating layer is quite thin, typically less than a wavelength of light, and can withstand gate voltages up to ±20 volts or more.

Integrated circuit 500 is a microelectronic oscillator circuit utilizing semiconductor devices configured to have a high gain amplifier for producing an output reference signal. Integrated circuit 500 uses crystal 501 to produce a desirable resonant frequency where crystal elements are well known in the art for producing stable output frequencies and for having high Q values. Input terminal 502 and output terminal 503 are connected to biasing resistors 504, 505, respectively. In the preferred embodiment, resistors 504, 505 are doped polysilicon resistors having a value of 342.9 ohms.

Resistors 504,505 are connected to an input protection circuit that provides integrated circuit 500 protection from electrostatic discharge voltages. These high-level voltages are commonly associated with causing fatalistic damage to MOSFET devices. The input protection circuit includes diodes 507/510 connected to input pads 506/509. Connected to the other end of each diode are FET 508/511 configured to be resistive. FETs 508/511 are n-channel devices having a minimum channel lengths (L=0.25 um) with a large widths (W=80.8 um).

Integrated circuit 500 also includes a power supply circuit used to provide a supply voltage to integrated circuit 500 including voltage divider network with resistors 530 and 531 and a capacitor 532 for filtering any noise associated with the supplied voltage wherein reference voltages, and configurations thereof, are well known in the art. In a preferred embodiment, resistors 530 and 531 are N-Well resistors valued at 11.4 K ohms and 19.95 K ohms respectively. The present invention uses N-Well CMOS processes, wherein N-Well CMOS processes are well known in the art. One such process of creating N-Well devices includes starting with a moderately doped (i.e. impurity concentration is typically less than $10^{15}$ $cm^{-3}$) p-type silicon substrate. An initial oxide layer is grown on the entire surface and lithographic mask defines the N-well region. Donor atoms, usually phosphorus, are implanted through this window in the oxide. Once the N-well is created, the active areas of the nMOS and pMOS FETs can be defined.

Integrated circuit 500 includes amplifier 513 having feedback resistor 516 coupled between input terminal 514 and output terminal 515 of amplifier 513. Amplifier 513 is configured to be an inverting amplifier biased by a network to oscillate. The biasing network includes resistors 517 and 518 configured to be a voltage divider for maintaining amplifier 513 at a constant voltage of VDD/2. In the preferred embodiment, resistors 517 and 518 are N-Well resistors having a value of 400 ohms. Additionally, feedback resistor 516 is an N-Well resistor valued at 321 Kohms to provide a gain of 50 for amplifier 513. Certainly, other resistor values for creating higher or lower gain values can be used without departing from the scope of the present invention.

Coupling capacitor 512 is connected to amplifier 513 and the input protection circuit. Coupling capacitor 512 is preferably 3 pF and ensures that leakage current between amplifier 513 and the input protection network are minimized. In the preferred embodiment of the present invention, a high value of DC feedback to amplifier 513 is afforded, and not effected, by leakage currents. This is accomplished by providing an N-Well resistor as feedback resistor 516 and through providing coupling capacitor 512 created by composite layers of polysilicon/second metal/fourth metal to first metal/third metal capacitor with the first metal/third metal layers being coupled to input terminal 514 of amplifier 513. This ensures that no leakage can occur between the input protection circuit and amplifier 513. Additionally, in the preferred embodiment capacitor 512 does not have any significant parasitic capacitance for capacitive voltage division.

Integrated circuit 500 further includes input capacitor 524 and output capacitor 525 coupled to resistors 504 and 505 respectively. In the preferred embodiment, capacitors 524 and 525 are FET devices with the sources and drains of the FETs tied to ground. The gates of the FETs are coupled to resistors 504 and 505 thus utilizing the gate oxide of the FET as a dielectric. Capacitor 524 is preferably 5.7 pF having a width of 81.2 um and a length of 9.95 um. Capacitor 525 is preferably 17.3 pF having a width of 81.2 um and a length of 30 um. This series combination of capacitors 524, 525 is seen by crystal 501 as having a value of 4.28 pF. With capacitor 524 having a value smaller than capacitor 525, the input voltage to amplifier 513 is higher than the output voltage, ensuring a low start-up voltage for amplifier 513. It is well known in the art that an oscillator circuit requires an input signal, usually noise, to begin oscillations. The instant invention, through using a high-gain amplifier, requires less noise to start-up oscillations within amplifier 513. Therefore, integrated circuit 500 requires a start-up voltage of approximately 1.7 volts.

Integrated circuit 500 is further configured to have an output stage connected to input 514 of amplifier 513 having a first inverting buffer 520, Schmitt-trigger amplifier 521, and second inverting buffer 522. In the preferred embodiment of the present invention, the output stage is coupled to input 514 of amplifier 513 for two reasons. First, the input voltage to Schmitt-trigger amplifier 521 is higher at input terminal 514. Second, the input signal and its energy come from a very high Q as represented in the following equation:

$$Q = \frac{\sqrt{\frac{L}{C}}}{RI} = \frac{\sqrt{\frac{6 \text{ mH}}{18 \text{ fF}}}}{30} = 19,000$$

The high Q value of crystal 501 within integrated circuit 500 ensures that the jitter at Schmitt-trigger amplifier 521 is approximately 5 ps for a 1.4 MHZ signal. The electrical characteristics of the instant invention illustrated in FIG. 5 are shown in Table 1 below.

TABLE 1

| Parameter | Condition | typ | unit |
|---|---|---|---|
| start-up voltage | 1.4 MHZ, Q = 19,000, no external cap. | 1.7 | V |
| sustaining voltage | 1.4 MHZ, Q = 19,000 no external cap. | 1.2 | V |
| start-up time | 1.4 MHZ, Q = 19,000, no external cap., VDD = 2.5 V | 0.8 | ms |
| output jitter | 1.4 MHZ, Q = 19,000, no external cap. | 5 | ps |

It will be understood by those skilled in the art that the embodiments set forth hereinbefore are merely exemplary of the numerous arrangements for which the invention may be practiced, and as such may be replaced by equivalents without departing from the invention which will now be defined by appended claims.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. An integrated circuit apparatus comprising:

at least one input protection circuit;

an element coupled to said at least one input protection circuit, said element configured to resonate;

an amplifier coupled to said element, said amplifier having a feedback network;

a coupling element coupled to said amplifier and said input protection circuit, wherein said coupling element reduces current leakage between said amplifier and said input protection circuit;

an input capacitive element coupled to said element; and an output capacitive element coupled to said element;

wherein said input capacitive element is smaller than said output capacitive element, thereby ensuring a low start-up voltage for said amplifier.

2. The apparatus, as recited in claim 1, further comprising an output stage coupled to said amplifier.

3. The apparatus, as recited in claim 2, wherein said output stage includes a trigger amplifier.

4. The apparatus, as recited in claim 1, wherein said amplifier further includes a biasing network for biasing said amplifier.

5. The apparatus, as recited in claim 1, wherein said feedback network includes a resistive element.

6. The apparatus, as recited in claim 1, further configured to be a microelectronic circuit.

7. The apparatus, as recited in claim 6, wherein said feedback network includes an N-Well resistor.

8. The apparatus, as recited in claim 1, further comprising at least one resistive element coupled to said element.

9. An oscillator circuit apparatus comprising:

an input protection circuit;

an element coupled to said input protection circuit, said element configured to resonate;

an oscillator circuit having an input terminal and an output terminal, said input terminal coupled to said element;

an output stage coupled to said input terminal of said oscillator circuit for receiving a signal from said oscillator circuit;

an input capacitor coupled to said element; and an output capacitor coupled to said element;

wherein said input capacitor is smaller than said output capacitor, thereby ensuring a low start-up voltage for said oscillator circuit.

10. The apparatus, as recited in claim 9, wherein said output stage further includes a trigger amplifier.

11. The apparatus, as recited in claim 9, wherein said output stage further includes at least one buffer element.

12. The apparatus, as recited in claim 9, wherein said oscillator circuit includes an inverting amplifier.

13. The apparatus, as recited in claim 9, further comprising a coupling element coupled to said element and said oscillator circuit, wherein said coupling element is configured to reduce current leakage.

14. The apparatus, as recited in claim 12, wherein said amplifier further includes a feedback network.

15. The apparatus, as recited in claim 9, further configured to be a microelectronic device.

* * * * *